United States Patent [19]
Harwer et al.

[11] Patent Number: 5,440,755
[45] Date of Patent: Aug. 8, 1995

[54] COMPUTER SYSTEM WITH A PROCESSOR-DIRECT UNIVERSAL BUS CONNECTOR AND INTERCHANGEABLE BUS TRANSLATOR

[75] Inventors: John J. Harwer, Laguna Niguel; Jimmy D'Jen, Irvine, both of Calif.

[73] Assignee: Accelerated Systems, Inc., Robbinsville, N.J.

[21] Appl. No.: 862,989

[22] Filed: Apr. 6, 1992

[51] Int. Cl.$^6$ .................. G06F 13/42; G06F 13/40; G06F 13/38; G06F 15/20

[52] U.S. Cl. .................. 395/800; 364/229.5; 364/232.8; 364/238.5; 364/239.9; 364/240.1; 364/240.2; 364/240.8; 364/242.92; 364/241.9; 364/DIG. 1; 364/DIG. 2; 364/490; 364/489

[58] Field of Search .............. 395/800, 700, 725, 200, 395/500, 550, 575, 275, 250, 325, 400, 775; 364/DIG. 1, DIG. 2, 490, 489; 340/735

[56] References Cited

U.S. PATENT DOCUMENTS

| | | | |
|---|---|---|---|
| 3,585,599 | 6/1971 | Hitt et al. | 395/275 |
| 4,213,177 | 7/1980 | Schmidt | 395/500 |
| 4,420,793 | 12/1983 | Strandberg | 361/413 |
| 4,479,198 | 10/1984 | Romano et al. | 364/DIG. 1 |
| 4,530,066 | 7/1985 | Ohwaki et al. | 364/708 |
| 4,530,069 | 7/1985 | Desrochers | 395/275 |
| 4,639,863 | 1/1987 | Harrison et al. | 364/DIG. 1 |
| 4,647,123 | 3/1987 | Chin et al. | 439/61 |
| 4,683,550 | 7/1987 | Jindrick et al. | 364/DIG. 2 |
| 4,742,477 | 5/1988 | Phillips et al. | 364/708 |
| 4,845,609 | 7/1989 | Lighthart et al. | 395/275 |
| 4,862,400 | 8/1989 | Selbrede | 364/708 |
| 4,884,069 | 11/1989 | Farand | 345/190 |
| 4,885,482 | 12/1989 | Sharp et al. | 364/DIG. 1 |
| 4,905,182 | 2/1990 | Fitch et al. | 395/275 |
| 4,931,923 | 6/1990 | Fitch et al. | 395/500 |
| 4,954,979 | 9/1990 | Eibner et al. | 340/735 |
| 4,971,563 | 11/1990 | Wells, III | 439/61 |
| 4,975,903 | 12/1990 | Wakerly et al. | 370/67 |
| 5,006,961 | 4/1991 | Monico | 361/413 |
| 5,025,412 | 6/1991 | Dalrymple et al. | 395/275 |
| 5,072,185 | 12/1991 | Rockwell | 324/539 |
| 5,191,657 | 3/1993 | Ludwig et al. | 395/325 |
| 5,227,957 | 7/1993 | Deters | 361/736 |

*Primary Examiner*—Alyssa H. Bowler
*Assistant Examiner*—Daniel Pan
*Attorney, Agent, or Firm*—Dennis H. Epperson

[57] ABSTRACT

A universal processor-direct bus structure on a specifically partitioned motherboard uses a separate local bus translator card to adapt to a specific local bus protocol and configuration. The processor-direct bus on the motherboard contains a superset of all of the primary signals required to implement any desired local bus structure. The translator card incorporates the connectors and bus translation protocol for a specific local bus structure on a separate card which is connected to the partitioned motherboard through the universal processor-direct bus. Thus, the universal processor-direct bus combined with the translator card makes it possible to have a standard bus (for example an ISA (Industry Standard Architecture) bus, EISA bus, MCA bus, PCI bus, C-bus, S-100 bus and/or other buses) mounted directly on the motherboard with one or more of the same standard buses or a different local bus interfaced to the motherboard through the universal processor-direct bus. This unique combination of a motherboard having a universal processor-direct bus with plug in local bus translator cards provides a unique, low cost, flexible solution to the problem of standard and local bus obsolescence, local bus non-upgradeability and local bus non-flexibility.

13 Claims, 2 Drawing Sheets

COMPUTER SYSTEM WITH A PROCESSOR-DIRECT UNIVERSAL BUS CONNECTOR AND INTERCHANGEABLE BUS TRANSLATOR

FIELD OF THE INVENTION

The present invention relates to the main and auxiliary printed circuit boards used in IBM AT and compatible computers, and other general purpose and specific purpose computers. The focus of the present invention is on the expansion buses for interfacing peripheral devices such as disk drives, video display controllers, network interfaces, modems, fax cards, etc. to the main computer.

BACKGROUND OF THE INVENTION

IBM AT or compatible computers ("clones") comprise by far the largest installed base of computers ever built. The core element of a typical IBM AT or compatible computer is a printed circuit board called a motherboard. The motherboard comprises at least one CPU or microprocessor (e.g., an Intel or compatible 80286, 80386, 80486 or 80X86 microprocessor), memory (either chips mounted directly to the motherboard or SIMM sockets mounted to the board into which SIMM memory boards can be inserted), I/O ports, keyboard port, etc. Additionally, the motherboard usually has multiple identical I/O expansion slot connectors each of which contains multiple electrical contacts or pins. The corresponding pins of each slot connector are connected in parallel to provide the same signals on corresponding pins of each of these parallel slot connectors. This parallel arrangement of slot connectors in combination with a bus protocol for communication with the CPU, is referred to collectively as a bus. Specific. peripheral or external devices (e.g., disk drives, modems, video controllers, tape drives, etc.), communicate with the CPU via an interface card, called a bus adapter card, which is plugged into one of the slot connectors on the bus. Devices connected to the bus slot connectors communicate with the CPU by means of specific groupings of signals from the interface card with a specific translation protocol.

A typical bus has three principal groups of signal lines: 1) address lines providing a memory address; 2) data lines for providing data to the memory address; and 3) control lines for providing control and timing signals necessary for the address and data lines to relay the desired information to the CPU. Examples of commonly used bus structures include: ISA (Industry Standard Architecture) bus, EISA bus, MCA bus, PCI bus, C-bus, S-100 bus etc. Each type of bus is characterized by many factors including speed of operation, cost and acceptance in the marketplace. Generally, the buses are not compatible, i.e., an interface card must be designed to operate with one specific bus type and will not work in any other type of bus.

Bus incompatibility creates problems of bus obsolescence, bus non-upgradeability and bus non-flexibility. For example, peripheral devices which are connected to a CPU incorporated into a motherboard which utilizes an ISA bus cannot later be attached to a motherboard which utilizes an MCA bus. Such a transfer of devices would require new interface boards specifically designed for use with the MCA bus. Thus, interchangeability of devices among computers utilizing different bus structures is very difficult and expensive, and sometimes not possible. Such obsolescence affects primarily current computer motherboards and CPU boards with regards to the various standard buses and specialty buses.

One approach taken by several manufacturers to minimize this obsolescence is to incorporate one or more local bus slots (a separate, specialized bus) on the motherboard in addition to an industry standard bus. Typically, slower peripherals, such as modems, floppies, printers, etc., are interfaced via the industry standard bus, while faster peripherals, such as video displays, hard disks and network interfaces, are interfaced via the separate local bus. Unfortunately, industry standards for the local bus do not exist and each vendor uses a unique local bus design which is often proprietary.

Since most vendors attempt to provide their own proprietary (and different) local bus signals and connectors, there exists a need to either 1) establish an industry wide local bus standard to which most vendors would provide various peripheral adapters, or 2) provide a universal bus slot on the motherboard capable of supporting all current and future local bus implementations. However, even option 1, establishment of a uniform local bus standard adopted by a majority of vendors, has serious disadvantages. First, implementation of new and more desirable local bus techniques would be hindered by the adoption of an industry standard. Additionally, changes in the industry standard would likely be difficult to make and would likely render equipment built to an older standard obsolete. Thus, an industry wide local bus standard implemented on the motherboard may well thwart any possible future advances in local bus techniques. Thus, while adoption of a single industry wide local bus standard would overcome many of the disadvantages associated with having many different local buses, it would be even better to have a truly universal bus connection which could easily be changed to any desired local bus standard. In this manner, the high performance made possible by a local bus structure could be preserved without sacrificing the ability to rapidly and economically adapt to improvements in local bus technology.

SUMMARY OF THE INVENTION

The present invention overcomes many of the above described shortcomings by physically and logically separating major portions of the local bus from the motherboard. This is achieved by placing a universal processor-direct bus structure on a specifically partitioned motherboard and using a separate local bus translator card. The processor-direct bus contains a superset of all of the primary signals required to implement .any desired local bus structure. The translator card incorporates the connectors and bus translation protocol for a specific local bus structure on a separate card which is connected to the partitioned motherboard through the universal processor-direct bus. Thus, the universal processor-direct bus combined with the translator card makes it possible to have a standard bus (for example an ISA (Industry Standard Architecture) bus, EISA bus, MCA bus, PCI bus, C-bus, S-100 bus and/or other buses) mounted directly on the motherboard with one or more of the same standard buses or a different local bus interfaced to the motherboard through the universal processor-direct bus.

Separation of the local bus circuitry and local bus connectors from the motherboard onto the local bus translator card brings a simple and flexible solution to many of the issues stated earlier. Local bus translator cards are NOT an integral part of the motherboard. By inserting various local bus translator cards into the processor-direct bus on the motherboard, system buses can be changed or re-configured without exchanging the entire motherboard. The motherboard may contain one or more processor-direct buses as required. The local bus translator card logic translates the processor and motherboard signals to create local bus signals, which are then routed to local bus connectors required to implement the desired local bus(es).

In one embodiment of the invention, a partitioned motherboard comprises two buses: a primary standard bus (ISA, EISA etc.) and a secondary processor-direct bus. One type of local bus translator card comprises a pin-to-pin type bus extension card that merely adds slots, through the processor-direct bus, of the same bus type as the primary standard bus (ISA, EISA, etc.). A more complex local bus translator card comprises connectors and logic to support a completely different local bus standard, for example, the VESA local bus specification, the INTEL PCI (Peripheral Component Interconnect) local bus specification, and other local bus specifications. The primary bus (the bus supplied directly from the motherboard) and the secondary local bus (the bus supplied via the local bus translator card) may be combined on a single bus card or placed on separate bus cards.

In another embodiment, the invention comprises a partitioned motherboard with at least one standard bus connector and one processor-direct bus connector containing a superset of signals required to implement any local bus. The invention further comprises a removable local bus translator card that plugs into the processor-direct bus and provides a specific local bus.

Segmentation of the local bus implementation to the local bus translator cards allows support of many different local buses with the same motherboard. Thus, the present invention extends configurability and upgradeability of any such structured system, and protects the investment by extending its useful life.

These and other characteristics of the present invention will become apparent through reference to the following detailed description of the preferred embodiments and accompanying drawings.

DETAILED DESCRIPTION OF THE PREFERRED EMBODIMENTS

Figure 1:
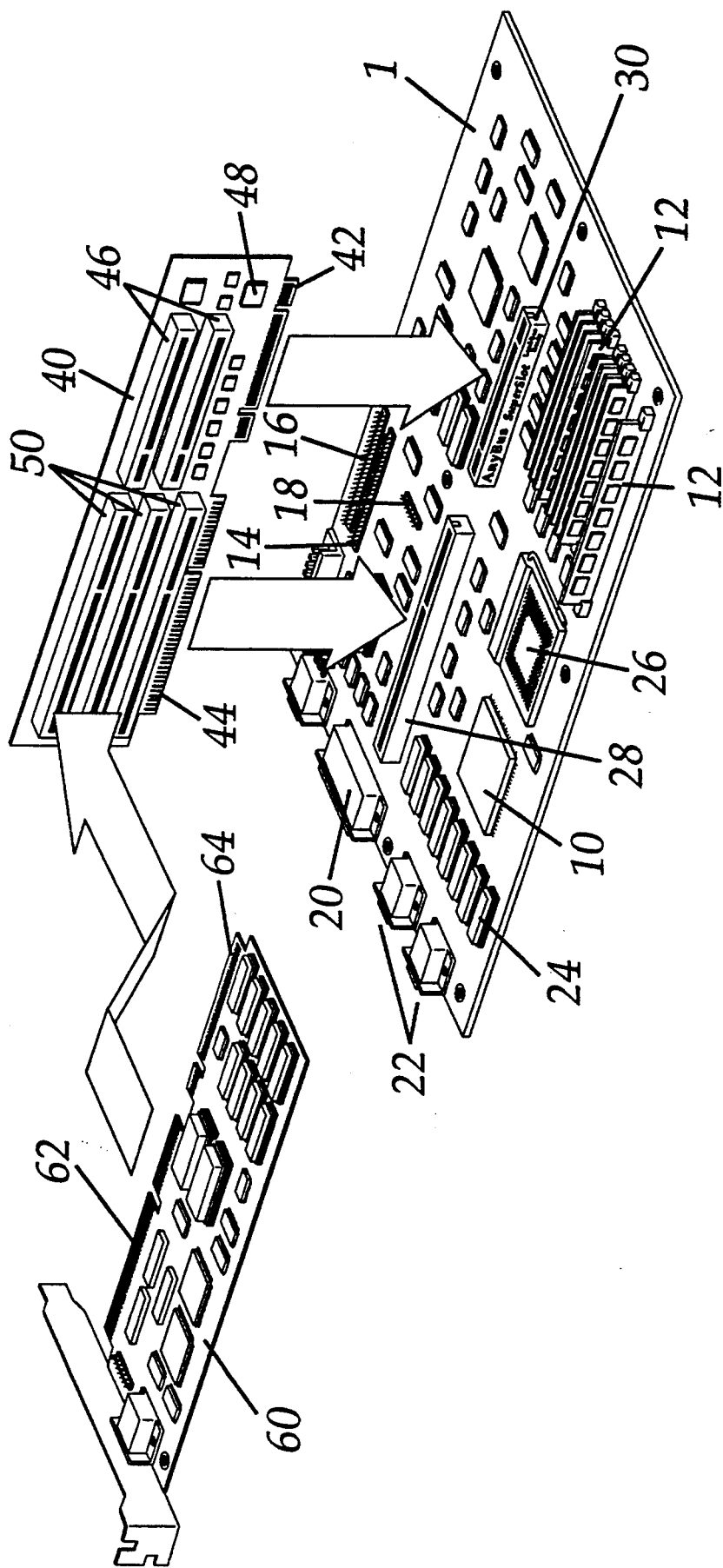
FIG. 1 is an exploded view of a preferred embodiment of the invention illustrating a partitioned motherboard having two buses (a standard ISA bus and a processor-direct bus) and a combination ISA bus riser/-local bus translator card.
Figure 2A:
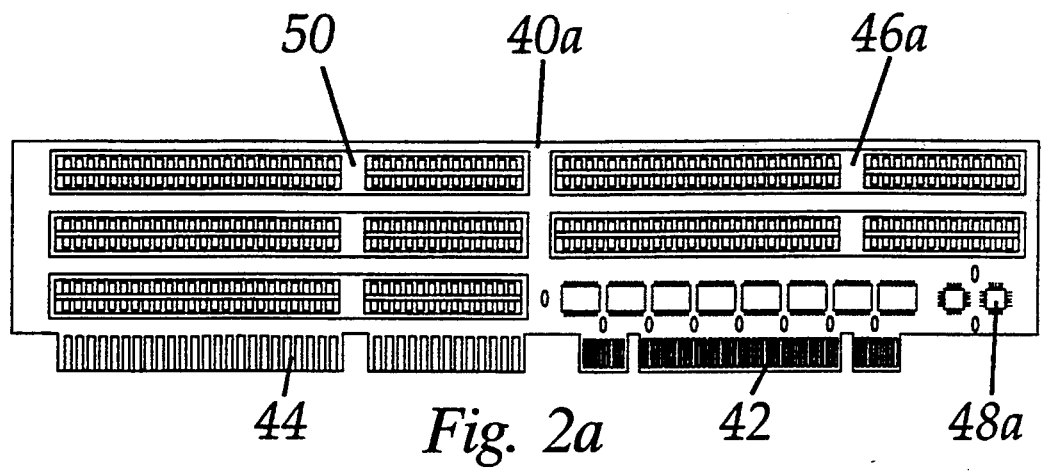
FIGS. 2a, 2b and 2c show top views of three typical local bus translator cards showing ISA bus contacts, processor-direct bus contacts, translation logic for three different local buses and local bus connectors for three different local buses.
Figure 2B:
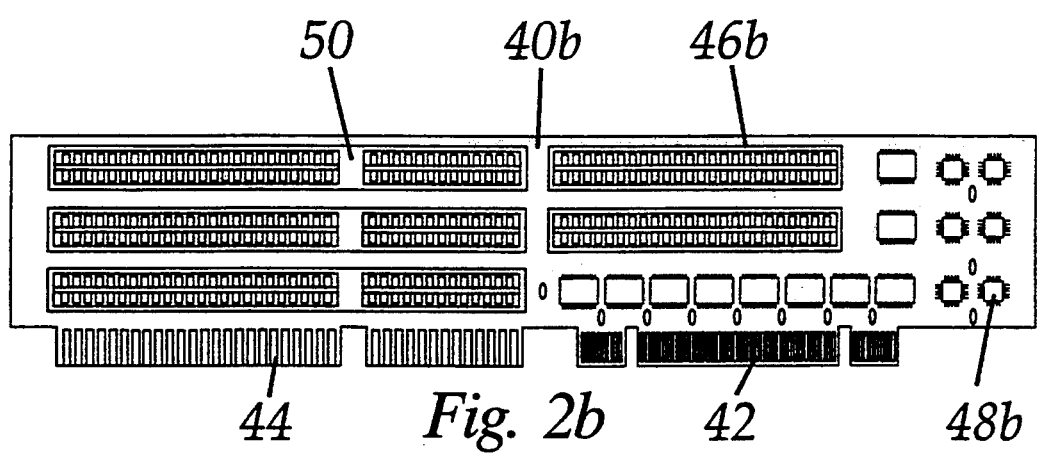
Figure 2C:
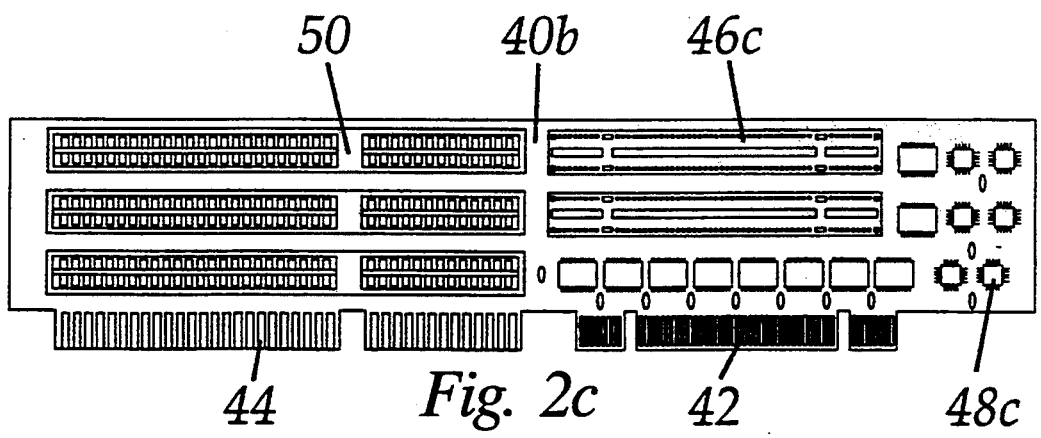
Figure 2D:
FIG. 2d shows a top view of a typical combination ISA bus connector/processor direct bus connector into which the cards shown in FIGS. 2a, 2b and 2c may be inserted.

Referring to FIG. 1 there is shown a typical design embodying the principles of the invention. A motherboard 1 comprises a CPU 10, memory 12, floppy disk drive connector (FDD) 14, hard disk drive connection (IDE) 16, modem/fax port 18, parallel port 20, two serial ports 22, cache memory 24, CPU overdrive socket 26, an ISA bus connector 28 and a processor-direct bus connector 30. A combination ISA bus riser card/local bus translator card 40 comprises contacts 42 for insertion into the processor-direct bus connector 30, contacts 44 for insertion into the ISA bus connector 28, local bus connectors 46, processor-direct to local bus logic circuitry 48, and ISA bus connectors 50. A video card 60 having both ISA bus contacts 62 and local bus contacts 64 is also shown in FIG. 1. The processor-direct connector 30 provides a superset of signals which enable any local bus to be implemented. That is, the superset of processor-direct local bus signals contains every signal which is required by any specific local bus protocol. This superset of local bus signals is passed to card 40 via contacts 42. The logic circuitry, shown generally as integrated circuit chips 48, on the card 40 translates the superset of signals into a specific local bus standard and transmits them to the pin out configuration for that particular local bus standard on the local bus connectors 46.

The local bus translator card 40 translates or converts each required signal from the processor-direct bus connector 30 into the specific local bus signal and pinout configuration comprising that specific local bus standard. This translation is performed by placing the translation circuits 48 directly on the translator card 40. Typically, the processor-direct signals are subjected to pulse shaping, buffering, shifting, narrowing, comparing, logical 'AND', 'OR' or 'XOR' operations, timing, synchronization, and other processing by these additional circuits 48, before they are routed to the local bus connector 46. (For example, the bus READY signal becomes TRUE only after all peripheral devices have completed the required operations and relinquished the bus.)

FIG. 2 illustrates three typical local bus translator cards 40a, 40b, 40c showing the processor-direct bus connectors 42, the translation logic circuitry 48a, 48b, 48c for three different local buses and the local bus connectors 46a, 46b, 46c for the three different local buses. All of these cards use the same standard ISA bus 50 but each has, in addition, another, possibly different, local bus. For example, card 40a shows the ISA bus 50 combined with another ISA bus 46a. Logic circuitry 48a converts the superset of processor-direct local bus signals into another ISA bus which is made available via contacts 46a. Card 40b shows the ISA bus 50 combined with an MCA bus 46b. Logic circuitry 48b converts the superset of processor-direct local bus signals into an MCA bus which is made available via contacts 46b. Card 40c shows the ISA bus 50 combined with a PCI bus 46c. Logic circuitry 48c converts the superset of processor-direct local bus signals into a PCI bus which is made available via contacts 46c. As shown in FIGS. 1 and 2, each of these cards 40a, 40b and 40c may be inserted into the same connectors 28, 30 on the motherboard 1.

Since the local bus translator cards 40 are much smaller, simpler and thus cheaper to design and build than either the partitioned motherboard 1 or any other typical motherboard, many local buses can be supported at very low cost. The local bus translator cards 40 provide configuration flexibility not possible with prior devices. Furthermore, there is no need to replace the motherboard 1 in order to upgrade the system to support many different or faster bus(es). Since the motherboard 1 is designed to include the processor-direct bus 30 which contains the superset of all signals required to construct any local bus, translator cards 40 for all existing and future buses (such as for example the INTEL PCI) can be added to the same motherboard. The present invention permits endless extensions to the life of the motherboard (1) and thus provides utility levels unmatched by any prior devices.

It will be understood that the apparatus and method of the present invention for a universal bus motherboard 1 using a universal-to-specific bus translator card 40 may be employed with any number of motherboards and/or processor-direct local buses and/or translator cards. The number of configurations possible under the present invention is virtually unlimited. The apparatus and method of the present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A computer comprising:
    a microprocessor subsystem module, wherein said microprocessor subsystem module further comprises:
        a central processor unit (cpu) having cpu address signal lines, cpu data signal lines and cpu control signal lines which form a central processor unit protocol independent superset of processor-direct signal lines wherein a subset of said superset of processor-direct signal lines includes cpu address signal lines, CPU data address signal lines and cpu control signal lines necessary for implementation of any one of a plurality of specific bus protocols including a first expansion bus protocol;
        a memory section coupled to said central processor unit; and
        a microprocessor subsystem module processor direct multi-line connector which is in direct electrical communication with said central processor unit superset of processor-direct signal lines; and
    a bus translator subsystem adapted for electrical connection to said microprocessor subsystem module via said microprocessor subsystem module processor direct multi-line connector, wherein said bus translator subsystem further comprises:
        a bus translator subsystem processor direct multi-line connector which mates with said microprocessor subsystem module processor direct multi-line connector for communicating with said microprocessor subsystem module through said central processor unit protocol independent superset of processor-direct signal lines; and
        a first expansion bus which communicates with said central processor unit and said memory section according to said first expansion bus protocol via said bus translator subsytem processor direct multi-line connector.

2. A computer system as defined in claim 1 further comprising a second expansion bus which communicates with said central processor unit and said memory section according to a second predetermined expansion bus protocol.

3. A computer system as defined in claim 1 wherein said first expansion bus protocol further comprises any one of a VESA local bus protocol or INTEL PCI local bus protocol.

4. A computer system as defined in claim 2 wherein said second predetermined expansion bus protocol further comprises any one of an ISA bus protocol, EISA bus protocol, MCA bus protocol, PCI bus protocol, C-bus protocol or S-100 bus protocol.

5. A computer system comprising:
    a central processor unit (cpu) having cpu address signal lines, cpu data signal lines and cpu control signal lines which form a central processor unit protocol independent superset of processor-direct signal lines wherein a subset of said superset of processor-direct signal lines includes cpu address signal lines, cpu data signal lines and cpu control signal lines necessary for implementation of any one of a plurality of specific bus protocols including a first expansion bus protocol, said first expansion bus protocol further comprising any one of a VESA local bus protocol or INTEL PCI local bus protocol;
    a memory section coupled to said central processor unit;
    a cpu processor direct multi-line connector which is in direct electrical communication with said central processor unit protocol independent superset of processor-direct signal lines; and a bus translator, said bus translator comprising:
        a bus translator processor direct multi-line connector which mates with said cpu processor direct multi-line connector for communicating with said central processor unit through said central processor unit protocol independent superset of processor-direct signal lines; and
        a first expansion bus which communicates with said central processor unit and said memory section according to said first expansion bus protocol via said bus translator processor direct multi-line connector.

6. A computer system as defined in claim 5 further comprising a second expansion bus which communicates with said central processor unit and said memory section according to a second predetermined expansion bus protocol.

7. A computer system as defined in claim 6 wherein said second predetermined expansion bus protocol further comprises any one of an ISA bus protocol, EISA bus protocol, MCA bus protocol, PCI bus protocol, C-bus protocol or S-100 bus protocol.

8. A computer system comprising:
    a microprocessor subsystem, wherein said microprocessor subsystem further comprises:
        a central processor unit (cpu) having cpu address signal lines, cpu data signal lines and cpu control signal lines which form a central processor unit superset of processor-direct signal lines wherein a subset of said superset of processor-direct signal lines includes cpu address signal lines, CPU data signal lines and cpu control signal lines necessary for implementation of any one of a plurality of specific bus protocols including a first expansion bus protocol;
        a memory section in communication with said central processor unit; and a microprocessor subsystem processor direct multi-line connector which is in direct electrical communication with said central processor unit superset of processor-direct signal lines; and a bus translator subsystem adapted for electrical connection to said microprocessor subsystem via said microprocessor subsystem processor direct multi-line connector, wherein said bus translator subsystem further comprises:

a bus translator subsystem processor direct multi-line connector which mates with said microprocessor subsystem processor direct multi-line connector for communicating with said microprocessor subsystem through said central processor unit superset of processor-direct signal lines;

a first expansion bus which communicates with said central processor unit and said memory section according to said first expansion bus protocol via said bus translator subsytem processor direct multi-line connector;

a second expansion bus which communicates with said central processor unit and said memory section according to a second predetermined expansion bus protocol comprising any one of an ISA bus protocol, EISA bus protocol, MCA bus protocol, PCI bus protocol, C-bus protocol or S-100 bus protocol.

9. A computer system comprising:

a central processor unit (cpu) having cpu address signal lines, cpu data signal lines and cpu control signal lines which form a central processor unit superset of processor-direct signal lines wherein a subset of said superset of processor-direct signal lines includes cpu address signal lines, CPU data signal lines and cpu control signal lines necessary for implementation of any one of a plurality of specific bus protocols including a first expansion bus protocol;

a memory section in communication with said central processor unit;

a cpu processor direct multi-line connector which is in direct electrical communication with said central processor unit superset of processor-direct signal lines;

a bus translator comprising:

a bus translator processor direct multi-line connector which mates with said cpu processor direct multi-line connector for communicating with said central processor unit through said central processor unit superset of processor-direct signal lines; and a first expansion bus which communicates with said central processor unit and said memory section according to said first expansion bus protocol via said bus translator processor direct multi-line connector; and a second expansion bus which communicates with said central processor unit and said memory section according to a second predetermined expansion bus protocol comprising any one of an ISA bus protocol, EISA bus protocol, MCA bus protocol, PCI bus protocol, C-bus protocol or S-100 bus protocol.

10. A bus translator comprising:

a bus translator processor direct multi-line connector adapted for connection to a central processor unit (CPU) protocol independent superset of processor-direct signal lines wherein said CPU protocol independent superset of processor-direct signals includes CPU address signal lines, CPU data signal lines and CPU control lines such that a subset of said protocol independent superset of processor-direct signal lines includes CPU address signal lines, CPU data signal lines and CPU control signal lines necessary for implementation of any one of a plurality of specific bus protocols including a first expansion bus protocol;

a first expansion bus which communicates with said central processor unit according to said first expansion bus protocol via said bus translator processor direct multi-line connector wherein said first expansion bus protocol comprises any one of a VESA local bus protocol or INTEL PCI local bus protocol; and a second expansion bus which communicates with said central processor unit according to a second predetermined expansion bus.

11. A bus translator as defined in claim 10 wherein said second predetermined expansion bus protocol further comprises any one of an ISA bus protocol, EISA bus protocol, MCA bus protocol, PCI bus protocol, C-bus protocol or S-100 bus protocol.

12. A bus translator comprising;

a bus translator processor direct multi-line connector adapted for connection to a central processor unit (CPU) superset of processor-direct signal lines wherein said CPU superset of processor-direct signal lines includes CPU address signal lines, CPU data signal lines and CPU control signal lines such that a subset of said superset of processor-direct signal lines includes CPU address signal lines, CPU data signal lines and CPU control signal lines necessary for implementation of any one of a plurality of specific bus protocols including a first expansion bus protocol;

a first expansion bus which communicates with said central processor unit according to said first expansion bus protocol via said bus translator processor direct multi-line connector;

a second expansion bus which communicates with said central processor unit according to a second predetermined expansion bus protocol comprising any one of an ISA bus protocol, EISA bus protocol, MCA bus protocol, PCI bus protocol, C-bus protocol or S-100 bus protocol.

13. A method of changing the expansion bus protocol on a computer comprising:

providing a connection to a central processor unit (CPU) protocol independent superset of processor-direct signal lines wherein said CPU protocol independent superset of processor-direct signal lines includes CPU address signal lines, CPU data signal lines and CPU control signal lines such that a subset of said protocol independent superset of processor-direct signal lines includes CPU address signal lines, CPU data signal lines and CPU control signal lines necessary for implementation of any one of a plurality of specific bus protocols including a first expansion bus protocol;

selecting a first subset of said protocol independent superset of processor-direct signal lines necessary for implementation of said first expansion bus protocol; and connecting said first subset of said protocol independent superset of processor-direct signal lines necessary for implementation of said first expansion bus protocol to a bus translator thereby forming a first expansion bus which functions in accordance with said first expansion bus protocol.

* * * * *

UNITED STATES PATENT AND TRADEMARK OFFICE
CERTIFICATE OF CORRECTION

PATENT NO.   : 5,440,755
DATED        : August 8, 1995
INVENTOR(S)  : John J. Harwer and Jimmy D'Jen It is certified that error appears in the above-identified patent and that said Letters Patent is hereby corrected as shown below:

```
     In column 5, at line 37, that portion reading "data address
signal" should read --data signal--;
     In column 5, at line 63, that portion reading "subsytem"
should read --subsystem--;
     In column 7, at line 20, that portion reading "subsytem"
should read --subsystem--;
     In column 7, at line 68 , that portion reading "signals"
should read --signal lines--;
     In column 8, at line 1, that portion reading "control
lines" should read --control signal lines--; and
     In column 8, at line 17, that portion reading "expansion
bus." should read --expansion bus protocol.--.
```

Signed and Sealed this

Twenty-sixth Day of November 1996

Attest:

BRUCE LEHMAN

*Attesting Officer*      Commissioner of Patents and Trademarks